United States Patent
Taracila et al.

(10) Patent No.: US 9,494,664 B2
(45) Date of Patent: Nov. 15, 2016

(54) NECK COIL ARRANGEMENTS FOR MAGNETIC RESONANCE IMAGING

(75) Inventors: Victor Taracila, Beachwood, OH (US); Fraser Robb, Aurora, OH (US); Miguel Angel Navarro, Lorain, OH (US); Darren Charles Gregan, Auburn Township, OH (US)

(73) Assignee: General Electric Company, Schenectady, NY (US)

( * ) Notice: Subject to any disclaimer, the term of this patent is extended or adjusted under 35 U.S.C. 154(b) by 1214 days.

(21) Appl. No.: 13/476,866

(22) Filed: May 21, 2012

(65) Prior Publication Data

US 2013/0307535 A1    Nov. 21, 2013

(51) Int. Cl.
*G01V 3/00* (2006.01)
*G01R 33/3415* (2006.01)
*G01R 33/34* (2006.01)
*G01R 33/36* (2006.01)
*G01R 33/48* (2006.01)

(52) U.S. Cl.
CPC ..... *G01R 33/3415* (2013.01); *G01R 33/34007* (2013.01); *G01R 33/34084* (2013.01); *G01R 33/3657* (2013.01); *G01R 33/481* (2013.01)

(58) Field of Classification Search
CPC .................................. G01R 33/34084
USPC .................................. 324/318, 322
See application file for complete search history.

(56) References Cited

U.S. PATENT DOCUMENTS

| | | | | |
|---|---|---|---|---|
| 5,285,160 A | * | 2/1994 | Loos et al. | 324/318 |
| 5,490,508 A | * | 2/1996 | Kato | 600/422 |
| 7,266,406 B2 | * | 9/2007 | Kroeckel | 600/410 |
| 7,518,365 B2 | * | 4/2009 | Driemel | 324/318 |
| 7,602,186 B2 | * | 10/2009 | Hoogeveen | 324/318 |
| 7,663,366 B2 | * | 2/2010 | Takamori | 324/318 |
| 7,970,452 B2 | | 6/2011 | Piron et al. | |
| 2008/0306377 A1 | | 12/2008 | Piron et al. | |

* cited by examiner

*Primary Examiner* — Louis Arana
(74) *Attorney, Agent, or Firm* — Dean D. Small; The Small Patent Law Group, LLC

(57) ABSTRACT

Systems and methods for coil arrangements in Magnetic Resonance Imaging (MRI) are provided. One arrangement includes a magnet bore, a radio-frequency (RF) transmit coil coupled to the magnet bore and at least one RF neck coil coupled to the magnet bore. The RF neck coil is movable within the magnet bore under and separate from a table within the magnet bore.

21 Claims, 7 Drawing Sheets ent in accordance with various embodiments.

NECK COIL ARRANGEMENTS FOR MAGNETIC RESONANCE IMAGING

BACKGROUND OF THE INVENTION

The subject matter disclosed herein relates generally to Magnetic Resonance Imaging (MRI) systems, and more particularly to neck coils for use in MRI systems.

MRI systems include a magnet, such as a superconducting magnet that generates a temporally constant (i.e., uniform and static) primary or main magnetic field. MRI data acquisition is accomplished by exciting magnetic moments within the primary magnetic field using radio-frequency (RF) coils. For example, in order to image a region of interest, the magnetic gradient coils are energized to impose a magnetic gradient to the primary magnetic field. RF transmit coils are then pulsed to create RF magnetic field pulses in a bore of an MRI scanner in order to acquire MR images of the region of interest using, for example, a phased array of RF receive coils. The resultant image that is generated shows the structure and function of the region of interest.

In MRI, neck imaging, in particular cervical spine (C-spine) and carotid artery imaging, are challenging due to the wide variability in people, especially in neck length and thickness, as the neck coils need to be positioned in close proximity to the neck region. However, even with receive coils that are patient centric, which are positionable on and around the person, and are made to accommodate a large percentage of the population, neck imaging is not optimized and may vary significantly from person to person.

BRIEF DESCRIPTION OF THE INVENTION

In accordance with various embodiments, a coil arrangement for a Magnetic Resonance Imaging (MRI) system is provided. The coil arrangement includes a magnet bore, a radio-frequency (RF) transmit coil coupled to the magnet bore, and at least one RF neck coil coupled to the magnet bore. The RF neck coil is movable within the magnet bore under and separate from a table within the magnet bore.

In accordance with other embodiments, a magnetic resonance imaging (MRI) system is provided that includes an imaging portion having a magnet bore, a radio-frequency (RF) transmit coil coupled to the magnet bore, and an RF neck coil coupled to the magnet bore. The RF neck coil is movable within the magnet bore along an examination axis under a table and upward towards the table.

In accordance with yet other embodiments, a method of medical imaging is provided. The method includes acquiring Magnetic Resonance (MR) data using a transmit coil coupled to a Magnetic Resonance Imaging (MRI) magnet bore and at least one radio-frequency (RF) neck coil movably coupled to the MRI magnet bore. The RF neck coil is movable along an examination axis of the MRI magnet bore and upward from under a table within the MRI magnet bore.

DETAILED DESCRIPTION OF THE INVENTION

Figure 1:
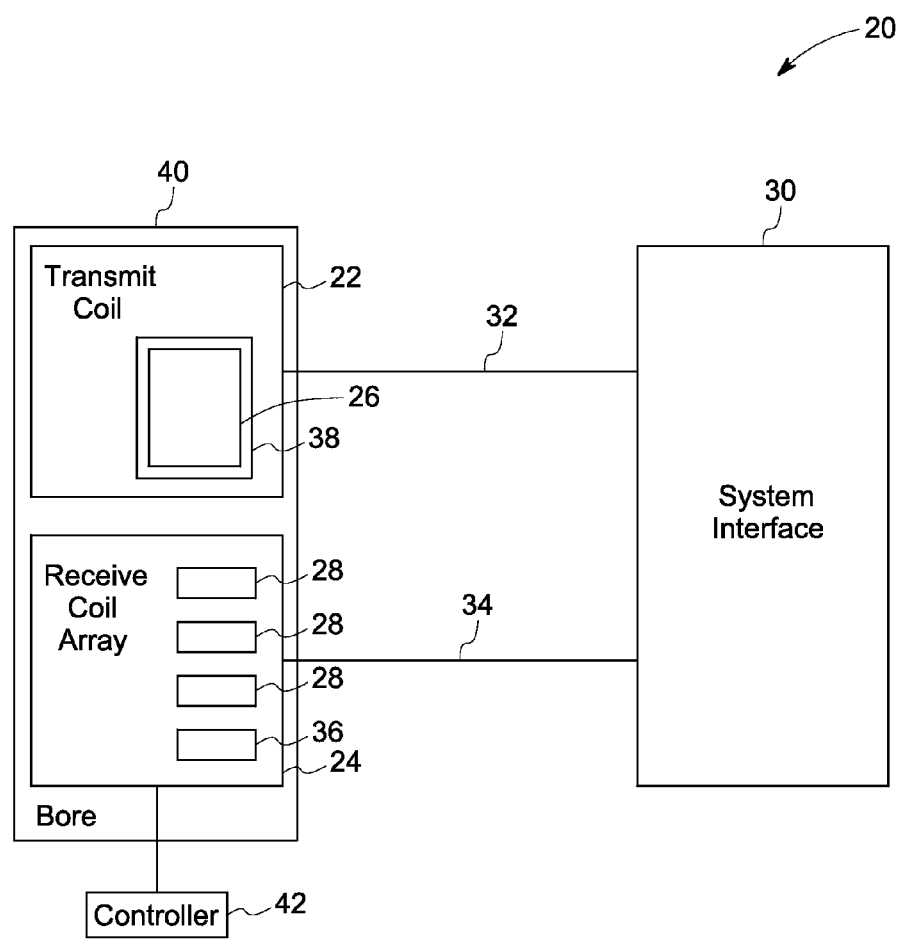
FIG. 1 is a block diagram of a transmit/receive section of a Magnetic Resonance Imaging (MRI) system in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide neck coil arrangements for Magnetic Resonance Imaging (MRI). In some embodiments, a radio-frequency (RF) neck coil is provided that is coupled to a bore of the MRI system under a patient table to allow movement within the bore and under the patient table. For example, the neck coil may be moved out of a field of view (FOV) of the imaging system components while remaining within the bore of the MRI system. The neck coil may be provided in combination with a posterior receive coil array positioned under the patient table. The neck coil may be liftable to bring the coil array up towards and around a neck of the patient.

Various embodiments may be implemented in connection with an MRI system, a block diagram of a transmit/receive section 20 of an MRI system is illustrated in FIG. 1. The transmit/receive section 20 is configured to acquire MR data using one or more coils, in particular RF coils. In the illustrated embodiment, a transmit coil 22 (e.g., a body coil) and one or more receive coil arrays 24 are provided within a bore 40 of the MRI system, which may also be referred to as the magnet bore. The receive coil array 24 includes or is provided in combination with a neck coil 36 as described in more detail herein. The receive coil array 24 is movable within the bore 40 with the neck coil 36 movable therewith, as well as providing additional movement to align the neck coil 36 with a neck of a patient. In various embodiments, the movement of the receive coil array 24 including the neck coil 36 is provided such that the coils move within the bore 40 and remain therein. Accordingly, the receive coil array 24, as well as the neck coil, is movable within the bore 40 and does not move outside the bore 40 as described in more detail herein. In some embodiments, the receive coil array 24 including the neck coil 36 is configured to translate within the bore 40 to at least one end of the bore 40. It should be noted that the movement of the receive coil array 24 and neck coil 36 may be limited by a limiter on a controller 42 that controls the movement thereof. In other embodiments, mechanical stops (not shown) may be provided, for example, at the ends of the bore 40.

In the illustrated embodiment, the transmit coil 22 includes a single RF coil 26 and the receive coil array 24 includes a plurality of plurality of individual RF coils 28 as well as the neck coil 36. For example, in one embodiment, the transmit coil 22 is an RF body coil, such as an RF birdcage coil. The RF body coil may be used as a whole-body RF coil. For a whole-body RF coil, the dimensions of the RF body coil are configured so that the RF body coil may be installed inside a superconducting magnet assembly or inside the bore 40 of the MRI system. The coils 28 of the receive coil array 24 in various embodiments are also configured to provide whole body imaging with the neck coil 36 configured to provide neck imaging (e.g., cervical spine (C-spine) and/or carotid artery imaging). In some other embodiments, the transmit coil 22 or the receive coil array 24 may be a local coil (e.g., a head coil or knee coil). It also should be noted that in some embodiments, one or more individual or single receive RF coils 28 are provided instead of or in addition to the receive coil array 24.

The transmit coil 22 and receive coil array 24, including the neck coil 36, within the bore 40 are coupled to a system interface 30. In operation, the transmit coil 22 is configured to transmit RF pulses and the receive coil array 24, which may include the neck coil 36 is configured to detect the MR signals, such as from a patient or a portion of the patient within the bore 40. In some embodiments, only a single coil array is provided, such that the coil array is configured to transmit RF pulses and also detect MR signals from the patient. It should be noted that an RF shield 38 may be provided around the transmit coil 22 to prevent the RF fields from penetrating the gradient coils (not shown) on the outside of the transmit coil 22, for example, on the outside of the body coil.

One or more connections or links are used to connect the transmit coil 22 and receive coil array 24 including the neck coil 36 to the system interface 30. For example, in one embodiment, one or more transmission lines 32 and 34 (e.g., coaxial cables) connect the transmit coil 22 and receive coil array 24 to the system interface 30. It should be noted that single transmission lines 32 and 34 are shown interconnecting the transmit coil 22 and receive coil array 24 with the system interface 30 for simplicity. However, in various embodiments, multiple transmission lines 32 and/or 34 may be used, such as depending on the number of coils used, the number of channels, etc. It should be noted that the transmission lines are not limited to coaxial cables, but may be any type of transmission line, for example, a stripline or microstripline.

Figure 2:
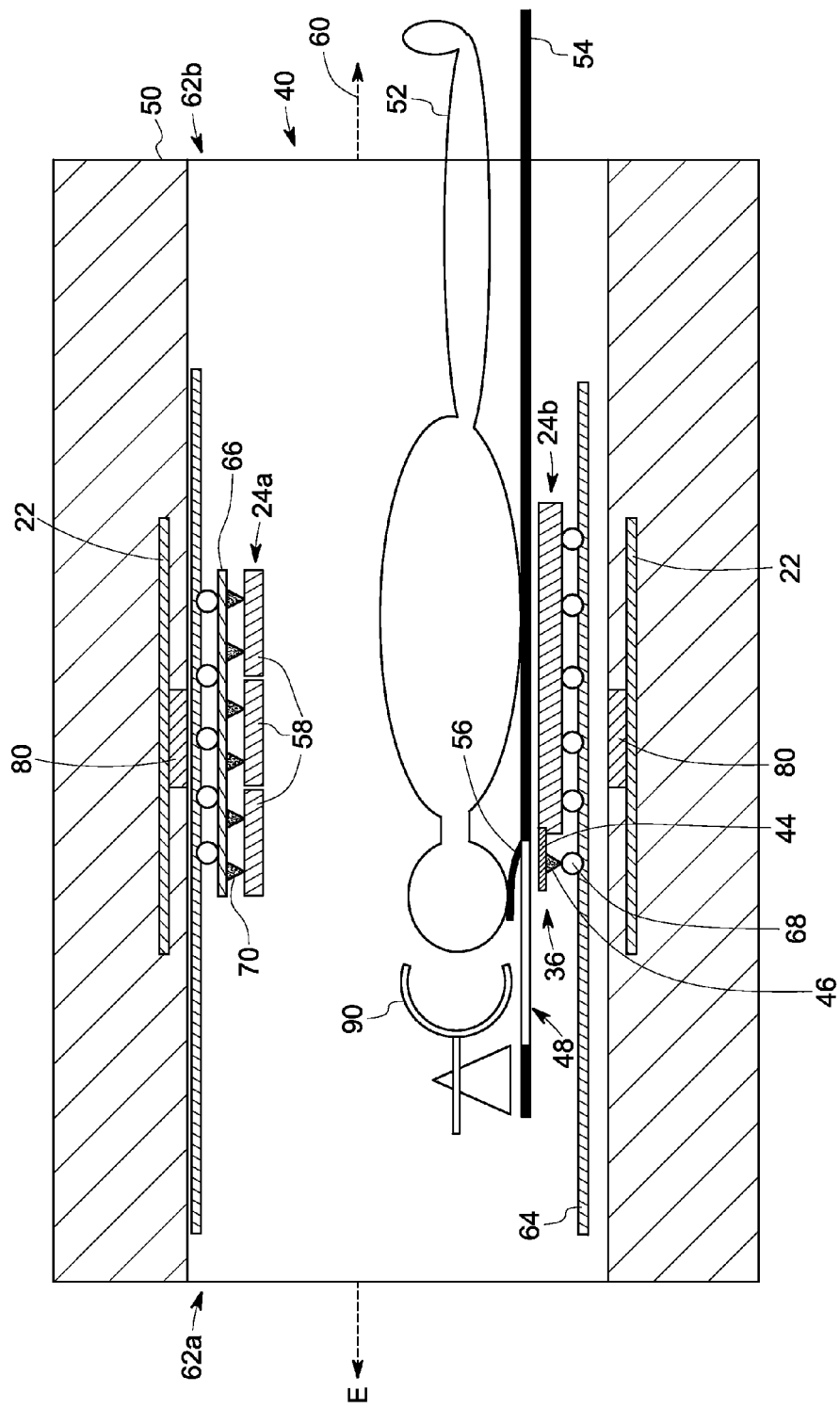
FIG. 2 is a side schematic diagram of a coil arrangement in accordance with various embodiments.

More particularly, in various embodiments, the neck coil 36 is provided as part of a system centric coil suite as illustrated in FIG. 2. In one embodiment, the neck coil 36 is a flexible coil such that one or more coil elements of the neck coil 36 are continuously pliable or conformable. As an example, the neck coil may comprise a Kapton material. However, in other embodiments, the neck coil 36 may be preconfigured in a molded receiving unit that is generally formed to align or correspond with the head of a patient 52. In still other embodiments, the neck coil 36 may be provided in a unit that may be discontinuously conformable, that is, have bendable or otherwise jointed segments or portions that articulate with respect to each other, with coils located in respective segments or portions.

In the illustrated embodiment, the neck coil 36 includes a coil array 44 that is coupled to an actuator 46 (e.g., a pneumatic actuator) that is configured to move the coil array 44 for positioning adjacent the neck of the patient 52. The actuator 46 in some embodiments allows movement in different directions or along different axis, for example, lifting motion and tilting motion. However, additional movements may be provided, such as rotating motion. The actuator 46 is coupled to a rail 64 along a bottom of a bore 40 formed within the bore 40 of a magnet 50. For example, the actuator 46 may be connected to rollers or wheels 68 that allow the neck coil 36 to move along the rail 64, for example, translate within the bore 40. In one embodiment, this coupling arrangement allows movement of the neck coil 36 along an examination (E) axis 60 as described in more detail herein.

The neck coil 36 when not in use is maintained within the bore 40 and allows a table 54 supporting the patient 52 to move within the bore 40 above the neck coil 36. When the neck coil 36 is to be used, the neck coil 36 is moved into position using the actuator 46, for example, lifting and/or tilting the coil array 44 towards and adjacent to the neck of the patient 52. As can be seen, the table 54 includes an opening 48 (e.g., cutout) to allow the neck coil 36, in particular, the coil array 44 or a portion thereof to pass therethrough to position the coil array 44 adjacent the neck of the patient 52. It should be noted that the head of the patient 52 may be supported in an elevated position on the table 54 and over the opening 48, for example, with a head support 56, which in various embodiments is configured to support the head and neck.

In operation, the neck coil 36 allows for MRI, such as of the C-spine and/or carotid artery of the patient 52 when the patient 52 is moved into the bore 40 formed within the magnet 50 and along the examination axis 60. It should be noted that the magnet 50 may be any type of MRI magnet structure, which may include, for example, wires wound around a former or wires forming a self-supporting structure. The wires may define a plurality of coils around a former (or in a self-supporting arrangement) forming a superconducting magnet.

As can be seen, the patient 52, which may include the entire patient 52, substantially all of the patient 52 or a portion of the patient 52, may be moved into the bore 40. For example, the patient may be supported on the table 54 that is movable within the bore 40 and along the examination axis 60. The table 54 may be a motorized table or may be a manually movable table. Also, only a portion of the table 54 may move into the bore 40, such as a cradle on a top of the table 54. It should be noted that the magnet 50 may generally define an outer structure with gradient coils (not shown in FIG. 2) positioned radially inward therefrom and the RF coils positioned radially inward from the gradient coils. In the illustrated embodiment, a receive coil array 24a and receive coil array 24b are positioned radially inward from the transmit coil 22 with the neck coil 36 provided in combination with the receive coil array 24b. For example, in one embodiment, the neck coil 36 is coupled to the receive coil arrays 24b such that both move together along the rail 64. However, in some embodiments, the receive coil arrays 24b and the neck coil 36 are separately and individually movable. Additionally, it should be noted that in some embodiments only the neck coil 36 is provided and the receive coil arrays 24a and 24b not provided within the bore 40.

In the illustrated embodiment, the transmit coil 22 is fixedly mounted, for example, within the bore 40. For example, the transmit coil 22 may be a body or birdcage coil that is fixedly mounted in relation to the bore 40 such that the transmit coil 22 does not move. It should be noted that the transmit coil 22 may be sized as desired or needed, for example, in one embodiment the transmit coil 22 has a width of between about 70 centimeters (cm) and 80 cm. Also, it should be noted that although the transmit coil 22 is shown as mounted and positioned generally at a middle of the bore 40 equidistance from ends 62 of the bore 40, the transmit coil 22 may be positioned at other axial locations along the examination axis 60 within the bore 40. Additionally, in some embodiments, the transmit coil 22 may be used for receive operation to receive MR data. In this embodiment, the transmit coil 22 is a transmit and receive coil In the illustrated embodiment, the receive coil array 24a (at the top of bore 40) includes a plurality of individual coil array portions 58 that are separately positionable radially within the bore 40 as described in more detail herein. Each of the receive coil arrays 24a and 24b, as well as the coil array portions 58 and the neck coil 36, may be formed from sets of coils (e.g., loop or saddle coils) that define the array. However, it should be appreciated that in some embodiments, one or more of the coil structures may be formed from a single coil.

The receive coil arrays 24a and 24b, the coil array portions 58 and/or the neck coil 36 may be formed from different sized and shaped coil elements that may be planar or non-planar. For example, in some embodiments one or more of the receive coil arrays 24a and 24b, the coil array portions 58 and/or the neck coil 36 may include curved coil elements, such as to conform to the body of the patient 52, such as the neck of the patient 52.

In the illustrated embodiment, the receive coil array 24a defines an anterior coil structure and the receive coil array 24b defines a posterior coil structure that also includes the neck coil 36. Accordingly, with the patient positioned within the bore 40, the receive coil array 24a is above the patient 52 and the receive coil array 24b with the neck coil 36 is below the patient 52, which in the illustrated embodiment is below the table 54. It should be noted that some portion of the receive coil array 24a and/or the receive coil array 24b may extend around the patient 52 such as towards a side of the patient 52.

The receive coil array 24a and the receive coil array 24b with the neck coil 36 are each mounted on a respective rail 64 or other structure that allows movement of the receive coil arrays 24a and 24b and the neck coil 36 within the bore 40 along the examination axis 60. For example, in one embodiment, (i) the receive coil array 24a and (ii) the receive coil array 24b and the neck coil 36 are coupled to respective rails 64 along the top and bottom of the bore 40. The rails 64 may be any type of rail structure that allow movement of the receive coil arrays 24a and 24b and the neck coil 36. It should be noted that the rails 64 may extend along the entire length of the bore 40 or may only extend along a portion of the length of bore 40 as shown in FIG. 2. For example, in the embodiment of FIG. 2 the receive coil arrays 24a and 24b and the neck coil 36 may be moved to the end 62a of the bore 40, but only a distance towards the end 62b. However, in other embodiments, the rails 64 may extend the entire length of the bore 40.

The receive coil arrays 24a and 24b and the neck coil 36 may be movably coupled to the rails 64 in any suitable manner to allow movement of thereof within the bore 40. For example, in one embodiment, the receive coil array 24a is coupled to a support structure or base 66 via one or more actuators 70 (e.g., a pneumatic lifting and lowering mechanism) as described in more detail herein to also allow radial movement of the receive coil array 24a, and more particularly, the coil array portions 58. The base 66 is then coupled to the rail 64 using one or more wheels 68 or other rolling or sliding members that allow the receive coil array 24a to translate along the rail 64 within the bore 40. Additionally, the receive coil array 24b including the neck coil 36 similarly has wheels 68 or other rolling or sliding members to movably couple the receive coil array 24b and the neck coil 36 (as described above) to the respective rail 64. It should be noted that the receive coil array 24b (not including the neck coil 36) in the illustrated embodiment is fixed radially within the bore 40 such that no actuating devices are provided. Accordingly, the receive coil array 24b may be mounted to a movable structure (e.g., a platform) having the wheels 68 or directly to the wheels 68. It should be noted that the receive coil array 24b may similarly include an actuating device, such as one or more actuators 70 to allow radial movement of the receive coil array 24b in other embodiments.

In various embodiments, as described in more detail below, the neck coil is configured for positioning in different radial and axial positions within the bore 40, the receive coil array 24a is configured for positioning in different radial and axial positions within the bore 40 and the receive coil array 24b is configured for positioning at different axial positions within the bore 40. The positioning of the neck coil 36, the receive coil array 24a and the receive coil array 24b may be controlled by the controller 42 (shown in FIG. 1), which may be based on, for example, a user input or an automatic scan protocol. The neck coil 36, the receive coil array 24a and the receive coil array 24b may be moved or positioned simultaneously, concurrently or separately. Additionally, the neck coil 36, the receive coil array 24a and the receive coil array 24b may be aligned generally at the same point along the examination axis 60 or at different points along the examination axis 60 and within the bore 40.

The neck coil 36 and the receive coil arrays 24a and 24b may be sized and shaped as desired or needed, for example, based on the requirements of the MRI system. In one embodiment, for example, the receive coil arrays 24a and 24b have a length of about 45 cm and a width of about 50 cm. However, any other dimension or shape may be provided for the receive coil arrays 24a and 24b.

Additionally, in some embodiments, a Positron Emission Tomography (PET) detector 80 may be provided. For example, the PET detector 80 may include one or more rings of PET detecting elements. The PET detector 80 in one embodiment is positioned radially inward from the transmit coil 22 and radially outward from the rails 64. Thus, the PET detector 80 in this embodiment is between the transmit coil 22 and the neck coil 36 and the receive coil arrays 24a and 24b. Although the PET detector 80 is shown as positioned generally at a middle and equidistance from the ends 62 of the bore 40, the PET detector 80 may be positioned at a different axial positioned along the examination axis 60. Additionally, the PET detector 80 may have different sizes. For example, in one embodiment, the PET detector has a width of about 25 cm to about 30 cm.

Thus, in various embodiments, the neck coil 36 and the receive coil arrays 24a and 24b may be moved out of a FOV within the bore 40, for example, out of the FOV of the transmit coil 22 and/or the PET detector 80 while remaining within the bore 40. For example, the neck coil 36 and the receive coil arrays 24a and 24b may be moved towards or to one of the ends 62 of the bore 40 while remaining within the footprint of the bore 40. The neck coil 36 and the receive coil arrays 24a and 24b may be moved out of the FOV, for example, when performing PET scanning of the patient 52 using the PET detector 80. As another example, the neck coil 36 and the receive coil arrays 24a and 24b may be moved out of the FOV of the transmit coil 22 when other receive coils are used, such as surface receive coils that are positioned on the patient 52 (e.g., a head, shoulder, hip, wrist or ankle specialty receive coil). Thus, a reduction of gamma attenuation for PET imaging may be provided and/or allowing scanning with local transmit or receive coils, such that the coupling between the different RF coils, for example the neck coil 36 and/or the receive coil array 24a and/or 24b and the surface receive coil, is reduced or eliminated. In one embodiment, for example, the bore 40 has a length of about 1.5 meters (m) while the FOV is less than about 50 cm for MRI and about 25 cm for PET imaging. Accordingly, the neck coil 36 and the receive coil arrays 24a and 24b may be moved, such as translated entirely outside of the FOV.

Figure 3:
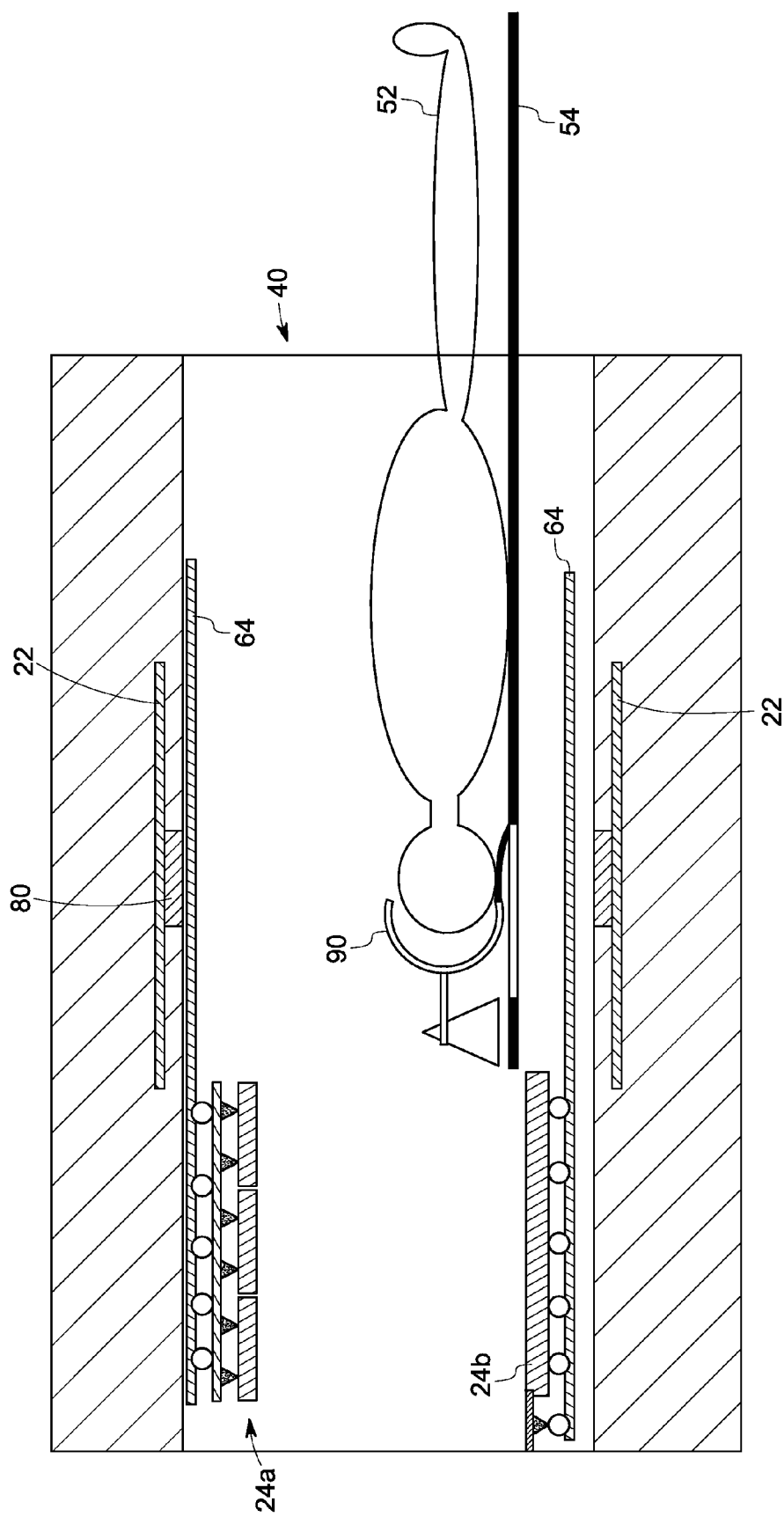
FIG. 3 is a side schematic diagram of a coil arrangement illustrating movement of coils in accordance with various embodiments.

For example as shown in FIG. 3, the neck coil 36 and the receive coil arrays 24a and 24b may be moved along the rails 64 and outside of the FOV of the transmit coil 22 and the PET detector 80. In the illustrated embodiment, the neck coil 36 and the receive coil arrays 24a and 24b are moved left (as viewed in FIG. 3) within the bore 40 away from the head of the patient 52. As can be seen, a specialty RF coil, for example, a head coil 90 may then be moved or positioned at the head of the patient 52 to perform a different MRI scan. Thus, the neck coil 36 and the receive coil arrays 24a and 24b are moved, for example, such that an unobstructed imaging of the head of the patient 52 may be performed (e.g., a neurological head scan), such as using the head coil 90, if neck imaging is not needed or desired. However, in other embodiments, the neck coil 36 and the receive coil arrays 24a and 24b are moved out of the FOV of the PET detector 80 to allow PET imaging. Thus, the patient 52 may be maintained and supported in a fixed position on the table 54 while performing different scans or different types of imaging.

It should be appreciated that although the rails 64 are shown as extending to the end 62a, the rails may extend to both ends 62a and 62b of the bore 40 or to the end 62b instead of 62a. For example, the rails 64 may extend to both ends 62a and 62b of the bore 40. In this embodiment, the neck coil 36 and the receive coil arrays 24a and 24b may be moved out of the FOV in either direction along the examination axis 60 (left or right as viewed in FIG. 3). For example, the neck coil 36 and the receive coil arrays 24a and 24b may be moved in a particular direction based on the types of additional scans to be performed, the location of the patient 52 in the bore 40, among others.

With respect to the movement of the neck coil 36 and the receive coil array 24a, the coil array 44 of the neck coil 36 and the coil array portions 58 are movable in a direction other than axially within the bore 40 along the examination axis 60. In particular, the coil array 44 and the coil array portions 58 are movable toward or away from the patient 52, which may include different types of movement to position the coil array 44 and coil array portions 58 in position for performing MRI.

Figure 4:
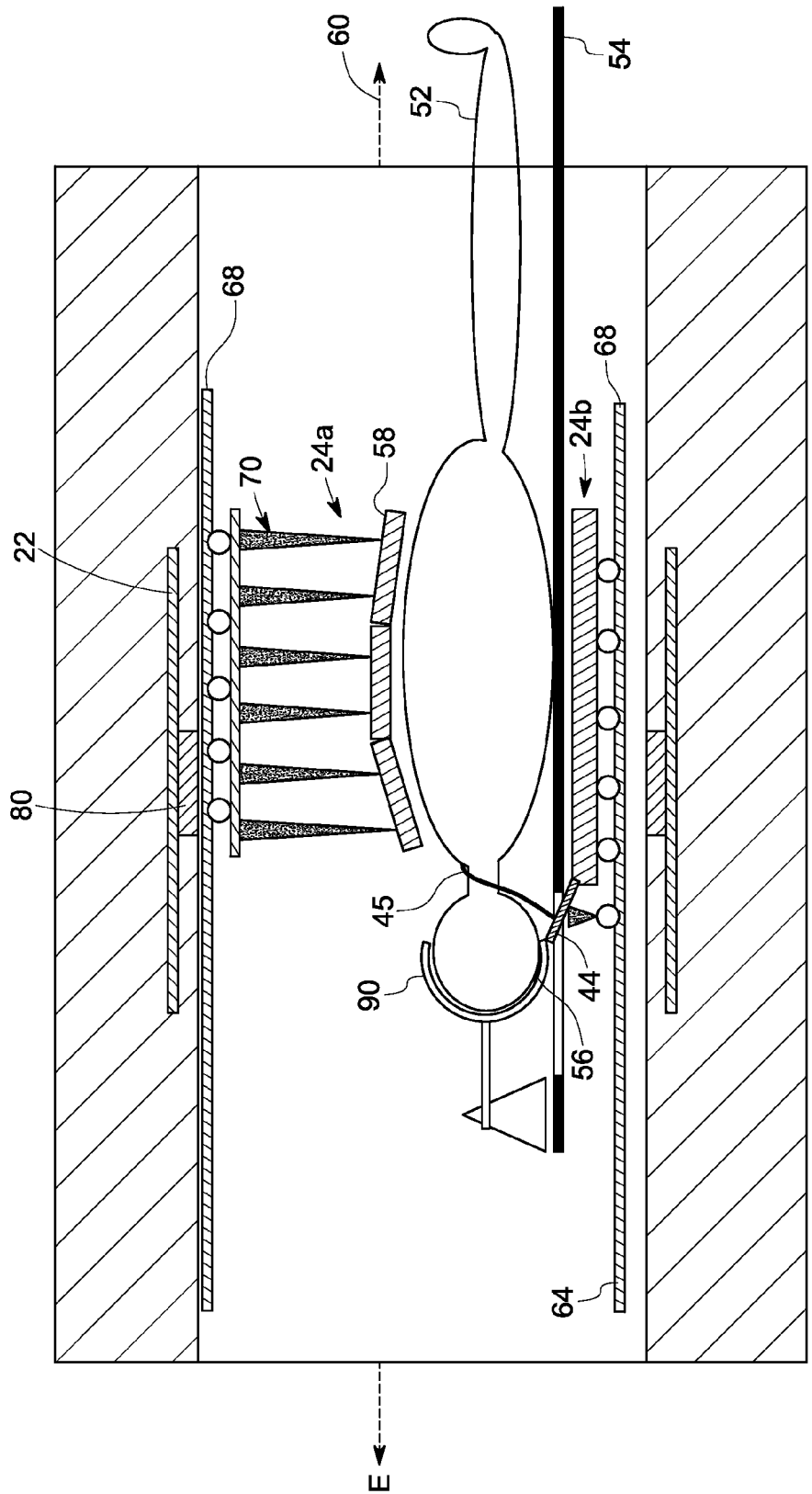
FIG. 4 is another side schematic diagram of a coil arrangement illustrating movement of a neck coil in accordance with various embodiments.

In one embodiment, the coil array 44 of the neck coil 36 is lifted and/or tilted upward by the actuator 46 as shown in FIG. 4 such that the coil array 44 is moved towards the neck region of the patient 52. For example, in one embodiment, the coil array 44 is moved (e.g., pneumatically lifted) until the coil array 44 reaches or abuts the head support 56. In particular, the actuator 46 lifts or raises the coil array 44 to surround a portion of the neck of the patient 52. In some embodiments, the coil array 44 includes wing portions 45 that extend and are bent (e.g., curved) or bendable to conform to and surround a portion of the neck of the patient 52.

Additionally, the actuators 70 move the coil array portions 58 to positions adjacent the body of the patient 52, which may include a tilting of the coil array portions 58 as shown in FIG. 4. However, in other embodiments, the coil array portions 58 are maintained in a generally horizontal orientation. It should be noted that the coil array 44 and the coil array portions 58 may be adjusted using different types of actuators, for example, pneumatically and/or mechanically to position the coil array 44 and the coil array portions 58 in an imaging position adjacent one or more portions of the patient 52.

Figure 5:
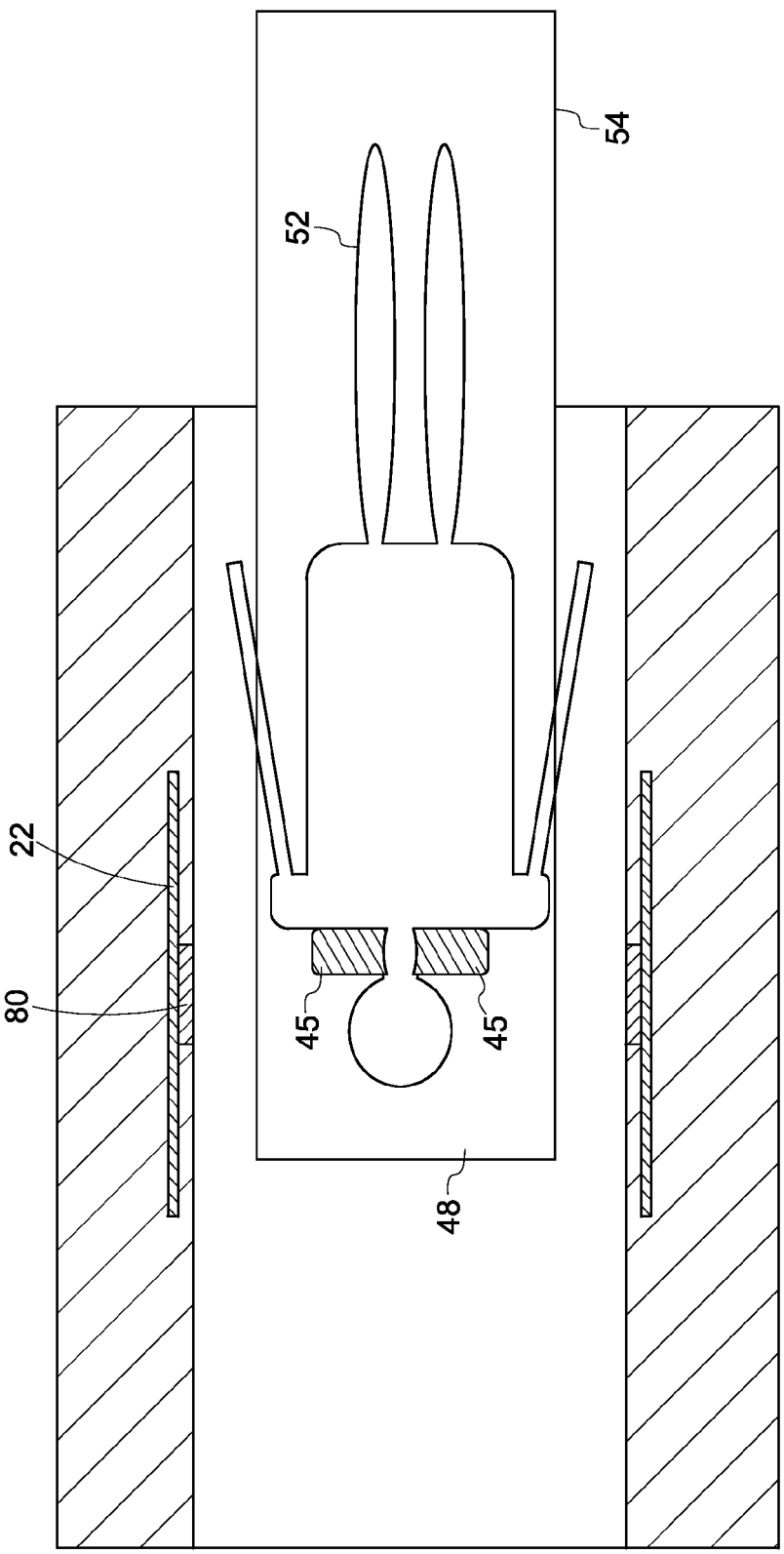
FIG. 5 is a top schematic diagram of a coil arrangement illustrating a neck coil in accordance with various embodiments.

The neck coil 36 may be positioned as shown in FIG. 5, illustrating a schematic top view within the bore 40. It should be noted that several of the components are not shown, including the receive coil arrays 24, the PET detector 80, and the rails 64 and associated components. As can be seen in FIG. 5, the neck coil 36 is moved upward toward the patient 52 and the wing portions 45 surround a portion of the neck of the patient 52. It should be noted that the wing portions 45 in some embodiments are separately movable upward from under the table 54 and inward to surround the neck of the patient 52. For example, the neck coil 36 may be moved upward such that the coil array 44 is positioned below the neck of the patient 52 and the wing portions 45 extend therefrom further upward and around the neck of the patient 52. In some embodiments, the wing portions 45 are curved and moved to encompass a portion of the neck of the patient 52 or may be tiled or rotated to encompass a portion of the neck of the patient 52. Accordingly, the wing portions 45 extend along sides and towards the front of the neck of the patient 52.

As can be seen, the head of the patient 52 is supported above the opening 48 by the head support 56 (shown in FIGS. 2 through 5) such that the neck coil 36 can extend therethrough to a position for performing MRI, such as to perform C-spine or carotid artery imaging. In various embodiments, the neck coil 36 is raised such that the center portion of the coil array 44 is stopped by the head support 56 with the sides of the coil array 44, illustrated as the wing portions 45, lifted unobstructed through the opening 48 in the table 54. It should be noted that the various portions of the neck coil 36 may be configured to move together or separately. It also should be noted that in some embodiments a rib-cage stopper may be attached to the head support 56.

Thus, in operation, for imaging the neck, the neck coil 36 may be positioned in close proximity to the neck of the patient 52. The neck coil 36 also may be removed or retracted from the FOV of other imaging components, such as for performing other types of imaging, which may be MRI or non-MRI.

With respect to the coil array portions 58, as illustrated in FIG. 4, each of the coil array portions 58 are separately movable and positionable within the bore 40. For example, each of the coil array portions 58 may be moved by one or more respective actuators 70 (two are shown for each coil array portions 58 for illustration) a different distance, such that the coil array portions 58 are positioned adjacent a portion of the patient 52, which may be at different heights or radial distances from the circumference of the bore 40. In one embodiment, the coil array portions 58 are moved and positioned adjacent to, but not touching the patient 52. The coil array portions 58 likewise may be moved if a different portion of the patient 52 is imaged.

Figure 6:
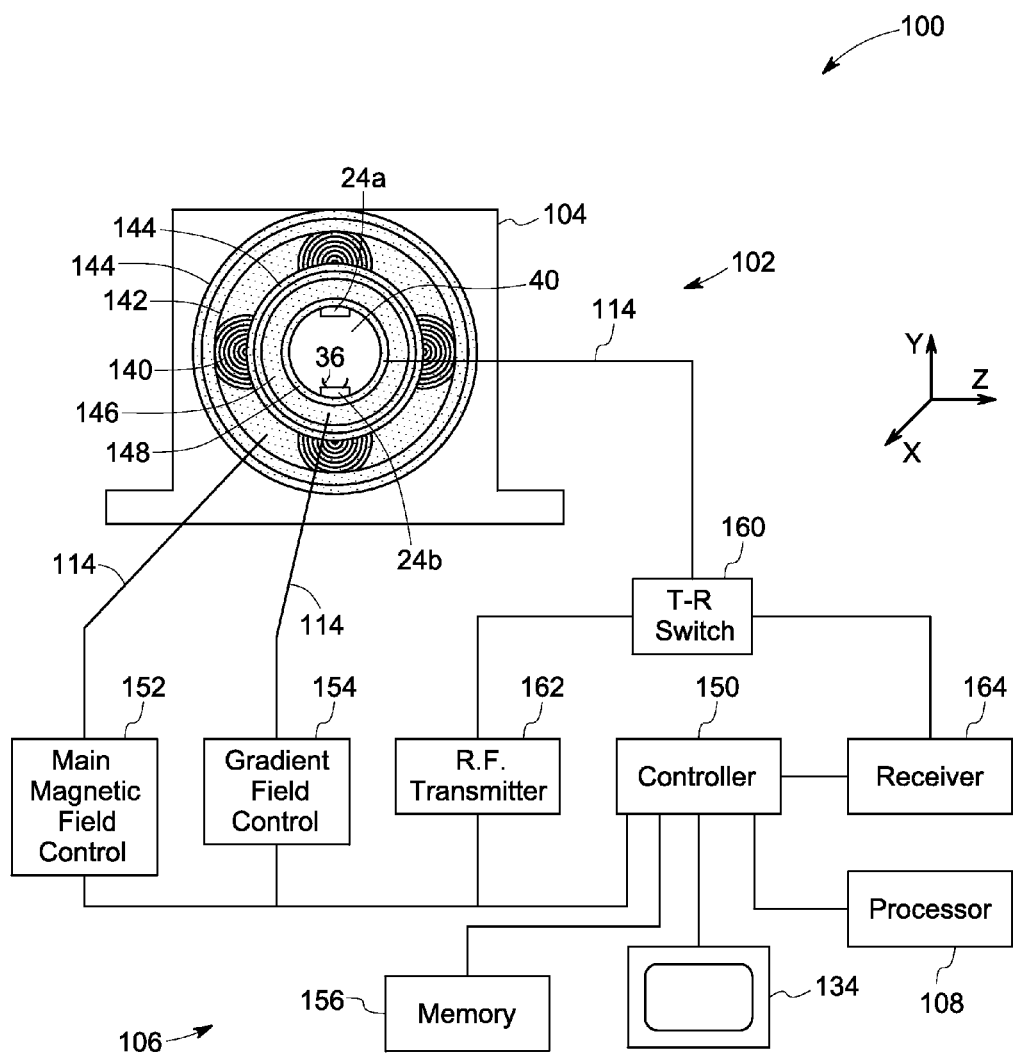
FIG. 6 is a schematic diagram of an exemplary medical imaging system in accordance with various embodiments.

Various embodiments may be provided as part of, or used with, a medical imaging system, such as the imaging system 100 shown in FIG. 6. It should be appreciated that although the imaging system 100 is illustrated as a single modality imaging system, the various embodiments may be implemented in or with multi-modality imaging systems. The imaging system 100 is illustrated as an MRI imaging system. Moreover, the various embodiments are not limited to medical imaging systems for imaging human subjects, but may include veterinary or non-medical systems for imaging non-human objects, luggage, etc.

Referring to FIG. 6, the imaging system 100 includes an imaging portion 102 having an imaging unit 104 (e.g., imaging scanner) and a processing portion 106 that may include a processor 108 or other computing or controller device. In particular, the imaging unit 104 enables the imaging system 100 to scan an object or patient to acquire image data, which may be image data of all or a portion of the object or patient. The imaging unit 104 includes one or more imaging components that allow acquisition of image data. The imaging components produce signals that represent image data that is communicated to the processing portion 106 via one or communication links 114 that may be wired or wireless. The patient may be positioned within the bore 40 using, for example, a motorized table and then MR imaging performed as described in more detail herein, which may include moving the receive coil arrays 24a and 24b.

In operation, an output of one or more of the imaging components is transmitted to the processing portion 106, and vice versa, which may include transmitting signals to or from the processor through a control interface 120, which may be embodied as the system interface 30 (shown in FIG. 1). The processor 108 also may generate control signals for controlling the position of the motorized table, imaging components and/or receive coil arrays 24a and 24b based on user inputs or a predetermined scan. For example, RF signals or transmit pulses may be communicated through the one or more communication link 114.

During a scan, image data, such as magnetic resonance image data from the imaging components may be communicated to the processor 108 through a data interface via the control interface, for example, as acquired by a body coil or surface coil.

The processor 108 and associated hardware and software used to acquire and process data may be collectively referred to as a workstation. The workstation may include, for example, a keyboard and/or other input devices such as a mouse, a pointer, and the like, and a monitor 134. The monitor 134 displays image data and may accept input from a user if a touchscreen is available.

In the exemplary embodiment, the imaging system 100 also includes a superconducting magnet 140 (e.g., the magnet 50) formed from magnetic coils supported on a magnet coil support structure. However, in other embodiments, different types of magnets may be used, such as permanent magnets or electromagnets. A vessel 142 (also referred to as a cryostat) surrounds the superconducting magnet 140 and is filled with liquid helium to cool the coils of the superconducting magnet 140. A thermal insulation 144 is provided surrounding the outer surface of the vessel 142 and the inner surface of the superconducting magnet 240. A plurality of magnetic gradient coils 146 are provided within the superconducting magnet 140 and an RF transmit coil 148 (which may be embodied as the transmit coil 22) is provided within the plurality of magnetic gradient coils 146. In some embodiments the RF transmit coil 148 may operate as a receive coil. Additionally, the receive coil arrays 24 are provided within the RF transmit coil 148. It should be noted that although the superconducting magnet 140 is a cylindrical shape, other shapes of magnets can be used.

The processing portion 106 also generally includes a controller 150, a main magnetic field control 152, a gradient field control 154, a memory 156, the display device 134, a transmit-receive (T-R) switch 160, an RF transmitter 162 and a receiver 164.

In operation, a body of an object, such as the patient 52 or a phantom to be imaged, is placed in the bore 40 on a suitable support, for example, a motorized table or other patient table. The superconducting magnet 140 produces a uniform and static main magnetic field $B_o$ across the bore 40. The strength of the electromagnetic field in the bore 40 and correspondingly in the patient, is controlled by the controller 150 via the main magnetic field control 152, which also controls a supply of energizing current to the superconducting magnet 140.

The magnetic gradient coils 146, which include one or more gradient coil elements, are provided so that a magnetic gradient can be imposed on the magnetic field $B_o$ in the bore 40 within the superconducting magnet 140 in any one or more of three orthogonal directions x, y, and z. The magnetic gradient coils 146 are energized by the gradient field control 154 and are also controlled by the controller 150.

The RF transmit coil 148 is arranged to transmit RF magnetic pulses and/or optionally detect MR signals from the patient if receive coil elements are not provided or moved from the FOV. In various other embodiments, the receive coil arrays 24 detect the MR signals. The RF transmit coil 148 and the receive coil arrays 24 are selectably interconnected to one of the RF transmitter 162 or receiver 164, respectively, by the T-R switch 160. The RF transmitter 162 and T-R switch 160 are controlled by the controller 150 such that RF field pulses or signals that are generated by the RF transmitter 162 are selectively applied to the patient for excitation of magnetic resonance in the patient.

Following application of the RF pulses, the T-R switch 160 is again actuated to decouple the RF transmit coil 148 from the RF transmitter 162. The detected MR signals are in turn communicated to the controller 150. The controller 150 includes a processor (e.g., image reconstruction processor), for example the processor 108, that controls the processing of the MR signals to produce signals representative of an image of the patient.

The processed signals representative of the image are also transmitted to the display device 134 to provide a visual display of the image. Specifically, the MR signals fill or form a k-space that is Fourier transformed to obtain a viewable image. The processed signals representative of the image are then transmitted to the display device 134.

Figure 7:
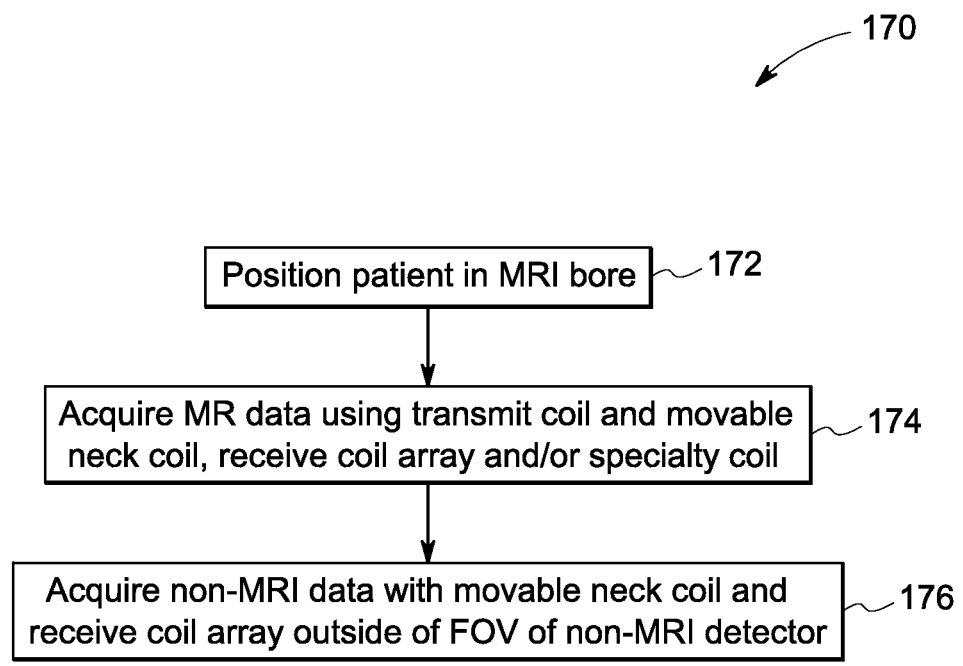
FIG. 7 is a flowchart of a method for performing imaging in accordance with various embodiments.

Various embodiments also provide a method 170 as shown in FIG. 7 for performing imaging, for example, medical imaging of a patient. In particular, the method includes positioning a patient within an MRI bore at 172, for example, within a magnet bore as described herein that includes movable RF receive coil arrays. Thereafter, MR data is acquired at 174 using a transmit coil and either the movable neck coil, the movable RF receive coil arrays or a specialty RF receive coil coupled or positioned on the patient as described herein. When MR data is acquired with the specialty RF receive coil, the movable neck coil and RF receive coil arrays are moved out of the FOV of the transmit coil.

The method 270 also includes acquiring non-MRI data at 176 with the movable neck coil and the movable RF receive coil arrays moved outside of the FOV of the non-MRI detector. For example, in one embodiment, as described herein, the movable neck coil and the movable RF receive coil arrays are moved out of the FOV of a PET detector and PET data acquired. It should be noted that steps 274 and 276 may be performed in any order and also iteratively.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, Reduced Instruction Set Computers (RISC), Application Specific Integrated Circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A coil arrangement for a Magnetic Resonance Imaging (MRI) system, the coil arrangement comprising:
 a magnet bore;
 a radio-frequency (RF) transmit coil coupled to the magnet bore; and
 at least one RF neck coil coupled to the magnet bore, the RF neck coil movable within the magnet bore under and separate from a table within the magnet bore, wherein the RF neck coil is configured to move outside of a field of view (FOV) of the RF transmit coil.

2. The coil arrangement of claim 1, wherein the RF neck coil comprises a posterior coil array configured to move along an examination axis within the magnet bore.

3. The coil arrangement of claim 1, wherein the RF neck coil comprises a posterior coil array configured to move radially within the magnet bore.

4. The coil arrangement of claim 3, wherein the RF neck coil is configured to move upward through an opening in the table.

5. The coil arrangement of claim 4, wherein the table includes a head support and the RF neck coil includes wing portions, a central portion of the neck coil stopped from upward movement by the head support with the wing portions extending through the opening.

6. The coil arrangement of claim 1, wherein the RF neck coil is bent to encompass a portion of a neck of a patient supported on the table.

7. The coil arrangement of claim 1, further comprising an actuator coupled to the RF neck coil; and
a rail extending along a length of the magnet bore, wherein the actuator is configured to move the RF neck coil within the magnet bore by moving along the rail.

8. The coil arrangement of claim 1, further comprising a Positron Emission Tomography (PET) detector configured to acquire PET data within the magnet bore and the RF neck coil is configured to move outside of a field of view (FOV) of the PET detector.

9. The coil arrangement of claim 1, further comprising at least one posterior receive coil array movable with the neck coil within the magnet bore along an examination axis.

10. A magnetic resonance imaging (MRI) system comprising:
an imaging portion having a magnet bore;
a radio-frequency (RF) transmit coil coupled to the magnet bore; and
an RF neck coil coupled to the magnet bore, the RF neck coil movable within the magnet bore along an examination axis under a table and upward towards the table, wherein the RF neck coil is configured to move outside of a field of view (FOV) of the RF transmit coil.

11. The MRI system of claim 10, wherein the RF neck coil comprises a posterior coil array configured to move radially within the magnet bore.

12. The MRI system of claim 10, wherein the RF neck coil is configured to move upward through an opening in the table.

13. The MRI system of claim 12, wherein the table includes a head support and the RF neck coil includes wing portions, a central portion of the neck coil stopped from upward movement by the head support with the wing portions extending through the opening.

14. The MRI system of claim 10, wherein the RF neck coil is bent to encompass a portion of a neck of a patient supported on the table.

15. The MRI system of claim 10, further comprising an actuator coupled to the RF neck coil; and
a rail extending along a length of the magnet bore, wherein the actuator is configured to move the RF neck coil within the magnet bore by moving along the rail.

16. The MRI system of claim 10, further comprising a Positron Emission Tomography (PET) detector configured to acquire PET data within the magnet bore and the RF neck coil is configured to move outside of a field of view (FOV) of the PET detector.

17. The MRI system of claim 10, further comprising at least one posterior receive coil array movable with the neck coil within the magnet bore along the examination axis.

18. The MRI system of claim 10, further comprising a plurality of anterior coil array portions, each including at least one RF receive coil, the coil array portions individually movable radially within the magnet bore.

19. A method of medical imaging, the method comprising:
acquiring Magnetic Resonance (MR) data using a transmit coil coupled to a Magnetic Resonance Imaging (MRI) magnet bore and at least one radio-frequency (RF) neck coil movably coupled to the MRI magnet bore, the RF neck coil movable along an examination axis of the MRI magnet bore and upward from under a table within the MRI magnet bore, wherein the RF neck coil is configured to move outside of a field of view (FOV) of the RF transmit coil.

20. The method of claim 19, further comprising moving the RF neck coil and acquiring MR data from a specialty receive coil, the movable RF neck coil moved out of a field of view of the transmit coil.

21. The method of claim 19, further comprising moving the RF neck coil and acquiring Positron Emission Tomography (PET) data from a PET detector within the MRI magnet bore, the movable RF neck coil moved out of a field of view of the PET detector.

* * * * *